United States Patent
Kong et al.

(10) Patent No.: US 8,169,344 B2
(45) Date of Patent: *May 1, 2012

(54) METHOD AND SYSTEM FOR AUDIO CODEC VOICE ADC PROCESSING

(75) Inventors: Hongwei Kong, Denville, NJ (US); Li Fung Chang, Holmdel, NJ (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/096,290

(22) Filed: Apr. 28, 2011

(65) Prior Publication Data

US 2011/0199242 A1 Aug. 18, 2011

Related U.S. Application Data

(63) Continuation of application No. 12/418,017, filed on Apr. 3, 2009, now Pat. No. 7,936,288, which is a continuation of application No. 11/565,591, filed on Nov. 30, 2006, now Pat. No. 7,515,071.

(51) Int. Cl.
*H03M 5/02* (2006.01)
(52) U.S. Cl. .......................................... 341/56; 455/574
(58) Field of Classification Search .................. 341/155, 341/143, 118, 120; 455/226.2, 333, 552, 455/415, 567
See application file for complete search history.

(56) References Cited

U.S. PATENT DOCUMENTS

| | | | |
|---|---|---|---|
| 4,772,871 A * | 9/1988 | Suzuki et al. | ................. 341/155 |
| 5,260,704 A | 11/1993 | Hustig et al. | |
| 5,644,310 A | 7/1997 | Laczko et al. | |
| 5,647,008 A | 7/1997 | Farhangi et al. | |
| 5,832,075 A | 11/1998 | Gancarcik | |
| 5,963,153 A | 10/1999 | Rosefield et al. | |
| 6,055,619 A | 4/2000 | North et al. | |
| 6,173,022 B1 | 1/2001 | McPherson et al. | |
| 6,208,671 B1 | 3/2001 | Paulos et al. | |

(Continued)

FOREIGN PATENT DOCUMENTS

EP 1734527 12/2006

(Continued)

OTHER PUBLICATIONS

Partial European Search Report corresponding to European Patent Application No. 07012194.4-1224, dated Mar. 31, 2008, 2 pages.

(Continued)

*Primary Examiner* — Joseph Lauture
(74) *Attorney, Agent, or Firm* — Sterne, Kessler, Goldstein & Fox PLLC

(57) ABSTRACT

Methods and systems for audio CODEC voice ADC processing are disclosed. Aspects of one method may include using a decimating filter that may be enabled to generate 13 MHz, 9-level digital output signal from a 26 MHz, 3-level digital input signal. The 13 MHz, 9-level digital output signal may be processed for RF transmission, for audio output to an output device, and/or utilized for testing by a test fixture, for example. The 13 MHz, 9-level digital output signal may be further processed to generate a 6.5 MHz, 33-level digital signal. The 6.5 MHz, 33-level digital signal may be converted to an analog signal, and processed for audio output and/or testing. The 13 MHz, 9-level digital output signal may also be processed to generate a 40 KHz, 17-bit digital signal, which may be communicated to a test equipment or further processed for RF transmission.

20 Claims, 11 Drawing Sheets

U.S. PATENT DOCUMENTS

| | | | |
|---|---|---|---|
| 6,314,330 | B1 | 11/2001 | Matthews |
| 6,353,364 | B1 | 3/2002 | Klemmer |
| 6,542,094 | B1 | 4/2003 | Venkitachalam et al. |
| 6,583,741 | B1 | 6/2003 | Knudsen |
| 6,606,044 | B2 | 8/2003 | Roeckner et al. |
| 6,646,500 | B2 | 11/2003 | Li et al. |
| 6,650,258 | B1 | 11/2003 | Kelly et al. |
| 6,728,584 | B1 | 4/2004 | Duan et al. |
| 6,742,153 | B1 | 5/2004 | Draxelmayr |
| 6,751,177 | B1 | 6/2004 | Abe et al. |
| 6,927,717 | B1 | 8/2005 | Oprescu |
| 6,987,953 | B2 | 1/2006 | Morris et al. |
| 7,129,873 | B2 | 10/2006 | Kawamura |
| 7,183,949 | B2 | 2/2007 | Park |
| 7,212,139 | B1 | 5/2007 | Katz |
| 7,227,478 | B1 | 6/2007 | Hendrix et al. |
| 7,233,268 | B1 | 6/2007 | Lin et al. |
| 7,280,878 | B1 | 10/2007 | Rossum |
| 7,463,170 | B2 | 12/2008 | Kong et al. |
| 7,515,071 | B2 | 4/2009 | Kong et al. |
| 7,536,004 | B2 | 5/2009 | Moquin |
| 7,787,529 | B2 | 8/2010 | Cheng et al. |
| 7,852,239 | B2 | 12/2010 | Kong et al. |
| 7,912,728 | B2 | 3/2011 | Kong et al. |
| 7,936,288 | B2 * | 5/2011 | Kong et al. .............. 341/56 |
| 2003/0083031 | A1 | 5/2003 | Eriksson et al. |
| 2003/0161486 | A1 | 8/2003 | Wu et al. |
| 2004/0064324 | A1 | 4/2004 | Graumann |
| 2004/0151263 | A1 | 8/2004 | Samueli et al. |
| 2005/0190926 | A1 | 9/2005 | Wang |
| 2005/0201494 | A1 | 9/2005 | Yoon |
| 2005/0278044 | A1 | 12/2005 | Chen et al. |
| 2006/0025074 | A1 | 2/2006 | Liang et al. |
| 2006/0222118 | A1 | 10/2006 | Murthy et al. |
| 2006/0256809 | A1 | 11/2006 | May |
| 2007/0037511 | A1 | 2/2007 | Capretta |
| 2008/0013763 | A1 | 1/2008 | Lotter et al. |
| 2008/0037151 | A1 | 2/2008 | Fujimoto et al. |
| 2008/0129558 | A1 | 6/2008 | Kong et al. |
| 2008/0130913 | A1 | 6/2008 | Kong et al. |
| 2008/0130916 | A1 | 6/2008 | Kong et al. |
| 2008/0130917 | A1 | 6/2008 | Kong et al. |
| 2008/0133224 | A1 | 6/2008 | Kong et al. |
| 2008/0133227 | A1 | 6/2008 | Kong et al. |
| 2009/0081953 | A1 | 3/2009 | Tian et al. |
| 2009/0098902 | A1 | 4/2009 | Kong et al. |
| 2009/0189793 | A1 | 7/2009 | Kong et al. |
| 2009/0316731 | A1 | 12/2009 | Kong |
| 2009/0319260 | A1 | 12/2009 | Kong et al. |
| 2010/0056050 | A1 | 3/2010 | Kong et al. |

FOREIGN PATENT DOCUMENTS

WO    WO 2005/098854    10/2005

OTHER PUBLICATIONS

European Search Report corresponding to European Patent Application Serial No. 07014096.7-2223, mailed Nov. 6, 2008, 3 pages.

Seng-Pan et al., "A novel half-band SC architecture for efficient analog impulse sampled interpolation." Electronics, Circuits and Systems, IEEE US, vol. 1, Sep. 7, 1998, pp. 389-393.

Liyuan et al., "A 20-Bit Sigma-Delta D/A for Audio Applications in 0.13um CMOS." Circuits and Systems, May 1, 2007, pp. 3622-3625.

* cited by examiner

| | 3 level input | | Upper Branch | | | Lower Branch | | | 9 level output |
|---|---|---|---|---|---|---|---|---|---|
| | $S_n$ | $S_{n-1}$ | $A0 = 1$ | $A1 = 1$ | OUT0 | $A0 = 0$ | $A1 = 2$ | OUT1 | OUT0 + OUT1 |
| 502 | −1 | −1 | −1 | −1 | −2 | 0 | −2 | −2 | −4 |
| 504 | −1 | 0 | −1 | 0 | −1 | 0 | 0 | 0 | −1 |
| 506 | −1 | +1 | −1 | +1 | 0 | 0 | +2 | +2 | +2 |
| 508 | 0 | −1 | 0 | −1 | −1 | 0 | −2 | −2 | −3 |
| 510 | 0 | 0 | 0 | 0 | 0 | 0 | 0 | 0 | 0 |
| 512 | 0 | +1 | 0 | +1 | +1 | 0 | +2 | +2 | +3 |
| 514 | +1 | −1 | +1 | −1 | 0 | 0 | −2 | −2 | −2 |
| 516 | +1 | 0 | +1 | 0 | −1 | 0 | 0 | 0 | +1 |
| 518 | +1 | +1 | +1 | +1 | +2 | 0 | +2 | +2 | +4 |

| | 9 level input | | Upper Branch | Lower Branch | 33 level output |
|---|---|---|---|---|---|
| | $S_n$ | $S_{n-1}$ | $OUT0 = S_n + S_{n-1}$ | $OUT1 = 2(S_{n-1})$ | $OUT0 + OUT1$ |
| 602 | -4 | -4 | -8 | -8 | -16 |
| 604 | -4 | -3 | -7 | -6 | -13 |
| 606 | -4 | -2 | -6 | -4 | -10 |
| 608 | -4 | -1 | -5 | -2 | -7 |
| 610 | -4 | 0 | -4 | 0 | -4 |
| 612 | -4 | +1 | -3 | +2 | -1 |
| 614 | -4 | +2 | -2 | +4 | +2 |
| 616 | -4 | +3 | -1 | +6 | +5 |
| 618 | -4 | +4 | 0 | +8 | +8 |
| 620 | -3 | * | (-7, -6, -5, -4, -3, -2, -1, 0, +1) | (-8, -6, -4, -2, 0, +2, +4, +6, +8) | (-15, -12, -9, -6, -3, 0, +3, +6, +9) |
| 622 | -2 | * | (-6, -5, -4, -3, -2, -1, 0, +1, +2) | (-8, -6, -4, -2, 0, +2, +4, +6, +8) | (-14, -11, -8, -5, -2, +1, +4, +7, +10) |
| 624 | -1 | * | (-5, -4, -3, -2, -1, 0, +1, +2, +3) | (-8, -6, -4, -2, 0, +2, +4, +6, +8) | (-13, -10, -7, -4, -1, +2, +5, +8, +11) |
| 626 | 0 | * | (-4, -3, -2, -1, 0, +1, +2, +3, +4) | (-8, -6, -4, -2, 0, +2, +4, +6, +8) | (-12, -9, -6, -3, 0, +3, +6, +9, +12) |
| 628 | +1 | * | (-3, -2, -1, 0, +1, +2, +3, +4, +5) | (-8, -6, -4, -2, 0, +2, +4, +6, +8) | (-11, -8, -5, -2, +1, +4, +7, +10, +13) |
| 630 | +2 | * | (-2, -1, 0, +1, +2, +3, +4, +5, +6) | (-8, -6, -4, -2, 0, +2, +4, +6, +8) | (-10, -7, -4, -1, +2, +5, +8, +11, +14) |
| 632 | +3 | * | (-1, 0, +1, +2, +3, +4, +5, +6, +7) | (-8, -6, -4, -2, 0, +2, +4, +6, +8) | (-9, -6, -3, 0, +3, +6, +9, +12, +15) |
| 634 | +4 | * | (0, +1, +2, +3, +4, +5, +6, +7, +8) | (-8, -6, -4, -2, 0, +2, +4, +6, +8) | (-8, -5, -2, +1, +4, +7, +10, +13, +16) |

METHOD AND SYSTEM FOR AUDIO CODEC VOICE ADC PROCESSING

CROSS-REFERENCE TO RELATED APPLICATIONS/INCORPORATION BY REFERENCE

The present application is a CONTINUATION of U.S. application Ser. No. 12/418,017, filed Apr. 3, 2009, now issued U.S. Pat. No. 7,936,288 which is a CONTINUATION of U.S. application Ser. No. 11/565,591, filed Nov. 30, 2006, now issued U.S. Pat. No. 7,515,071.

This application makes reference to:
U.S. patent application Ser. No. 11/565,414, filed Nov. 30, 2006, now issued U.S. Pat. No. 7,463,170;
U.S. patent application Ser. No. 11/565,342, filed Nov. 30, 2006;
U.S. patent application Ser. No. 11/565,373, filed Nov. 30, 2006, now issued U.S. Pat. No. 7,912,728;
U.S. patent application Ser. No. 11/565,358, filed Nov. 30, 2006; and
U.S. patent application Ser. No. 11/565,576, filed Nov. 30, 2006.

The above-identified applications are hereby incorporated herein by reference in their entirety.

This application also makes reference to:
U.S. patent application Ser. No. 12/250,233, filed Oct. 13, 2008; and
U.S. patent application No. 13/052,349, filed Mar. 31, 2011.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing signals at a wireless mobile terminal. More specifically, certain embodiments of the invention relate to a method and system for audio CODEC voice ADC processing.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may utilize audio coding and decoding (codec) devices that provide appropriate gain, filtering, and/or analog-to-digital conversion in the uplink direction to circuitry and/or software that provides audio processing and may also provide appropriate gain, filtering, and/or digital-to-analog conversion in the downlink direction to the output devices.

As audio applications expand, such as new voice and/or audio compression techniques and formats, for example, and as they become embedded into wireless systems, such as mobile phones, for example, novel codec devices may be needed that may provide appropriate processing capabilities to handle the wide range of audio signals and audio signal sources. In this regard, added functionalities and/or capabilities may also be needed to provide users with the flexibilities that new communication and multimedia technologies provide. Moreover, these added functionalities and/or capabilities may need to be implemented in an efficient and flexible manner given the complexity in operational requirements, communication technologies, and the wide range of audio signal sources that may be supported by mobile phones. In addition, more complex designs require more flexible and efficient testing interfaces and capabilities to be included as part of the design, which may allow the designer and the OEM to conduct testing of the product on a scale that may not have been achieved before.

As designs decisions are made for a new project to support different functionalities, the new design may not be compatible with existing circuitry, whether off-the shelf or previous in-house design. Accordingly, a design project may encounter additional delays in modifying the existing design to fit in with the new project.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for audio CODEC voice ADC processing, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5 is a diagram illustrating exemplary interpolation of 9 signal levels from 3 signal levels, in accordance with an embodiment of the invention.

FIG. 6 a diagram illustrating exemplary interpolation of 33 signal levels from 9 signal levels, in accordance with an embodiment of the invention.

DETAILED DESCRIPTION OF THE INVENTION

Certain embodiments of the invention may be found in a method and system for audio CODEC voice ADC processing. Aspects of the method may comprise using a decimating filter to generate 13 MHz, 9-level digital output signal from a 26 MHz, 3-level digital input signal. The 13 MHz, 9-level digital output signal may be further processed to generate a 6.5 MHz, 33-level digital signal. The 6.5 MHz, 33-level digital signal may be converted to an analog signal, and processed for audio output and/or loop-back mode testing. This may allow digital circuitry of the audio CODEC to be by-passed and may provide a test environment for testing both transmit and receive paths of an analog portion while a multimedia system may be operating. The 13 MHz, 9-level digital output signal may also be processed for RF transmission and/or for testing with commercial audio testing equipment. This may allow the digital circuitry of the audio CODEC to be by-passed and may provide a test environment for testing the transmit path of the analog portion while multimedia system may be operating.

Figure 1:
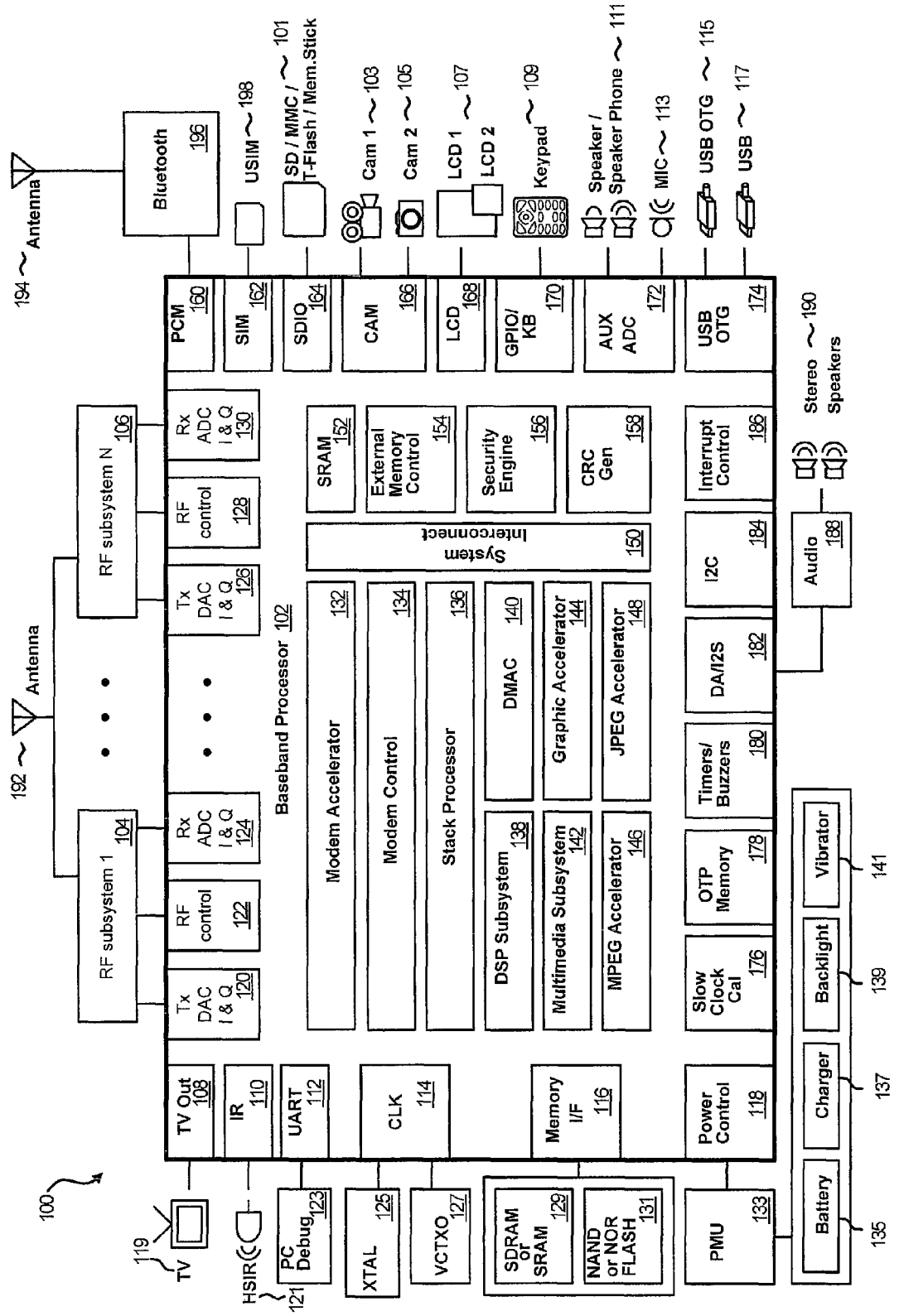
FIG. 1 is a block diagram that illustrates an exemplary multimedia baseband processor that enables handling of a plurality of wireless protocols, which may be utilized in connection with an embodiment of the invention.

FIG. 1 is a block diagram that illustrates an exemplary multimedia baseband processor that enables handling of a plurality of wireless protocols, which may be utilized in connection with an embodiment of the invention. Referring to FIG. 1, there is shown a wireless system 100 that may correspond to a wireless handheld device, for example. In this regard, the U.S. application Ser. No. 11/354,704, filed Feb. 14, 2006, discloses a method and system for a processor that handles a plurality of wireless access communication protocols, and is hereby incorporated herein by reference in its entirety. The wireless system 100 may comprise a baseband processor 102 and a plurality of RF subsystems 104, . . . , 106. In this regard, an RF subsystem may correspond to a WCDMA/HSDPA RF subsystem or to a GSM/GPRS/EDGE RF subsystem, for example. The wireless system 100 may also comprise a Bluetooth radio 196, a plurality of antennas 192 and 194, a TV 119, a high-speed infra-red (HSIR) 121, a PC debug block 123, a plurality of crystal oscillators 125 and 127, a SDRAM block 129, a NAND block 131, a power management unit (PMU) 133, a battery 135, a charger 137, a backlight 139, and a vibrator 141. The Bluetooth radio 196 may be coupled to an antenna 194. The Bluetooth radio 196 may be integrated within a single chip. The wireless system 100 may further comprise an audio block 188, one or more speakers such as speakers 190, one or more USB devices such as of USB devices 117 and 119, a microphone (MIC) 113, a speaker phone 111, a keypad 109, a plurality of LCD's 107, one or more cameras such as cameras 103 and 105, removable memory such as a memory stick 101, and a UMTS subscriber identification module (USIM) 198.

The baseband processor 102 may comprise a TV out block 108, an infrared (IR) block 110, a universal asynchronous receiver/transmitter (UART) 112, a clock (CLK) 114, a memory interface 116, a power control block 118, a slow clock block 176, an OTP memory block 178, a timers block 180, an inter-integrated circuit sound (I2S) interface block 182, an inter-integrated circuit (I2C) interface block 184, an interrupt control block 186. The baseband processor 102 may further comprise a USB on-the-go (OTG) block 174, an AUX ADC block 172, a general-purpose I/O (GPIO) block 170, a LCD block 168, a camera block 166, a SDIO block 164, a SIM interface 162, and a pulse code modulation (PCM) block 160. The baseband processor 102 may communicate with the Bluetooth radio 196 via the PCM block 160, and in some instances, via the UART 112 and/or the I2S block 182, for example.

The baseband processor 102 may further comprise a plurality of transmit (TX) digital-to-analog converter (DAC) for in-phase (I) and quadrature (Q) signal components 120, . . . , 126, plurality of RF control 122, . . . , 128, and a plurality of receive (Rx) analog-to-digital converter (ADC) for I and Q signal components 124, . . . , 130. In this regard, receive, control, and/or transmit operations may be based on the type of transmission technology, such as EDGE, HSDPA, and/or WCDMA, for example. The baseband processor 602 may also comprise an SRAM block 152, an external memory control block 154, a security engine block 156, a CRC generator block 158, a system interconnect 150, a modem accelerator 132, a modem control block 134, a stack processor block 136, a DSP subsystem 138, a DMAC block 140, a multimedia subsystem 142, a graphic accelerator 144, an MPEG accelerator 146, and a JPEG accelerator 148. Notwithstanding the wireless system 100 disclosed in FIG. 1, aspects of the invention need not be so limited.

Figure 2A:
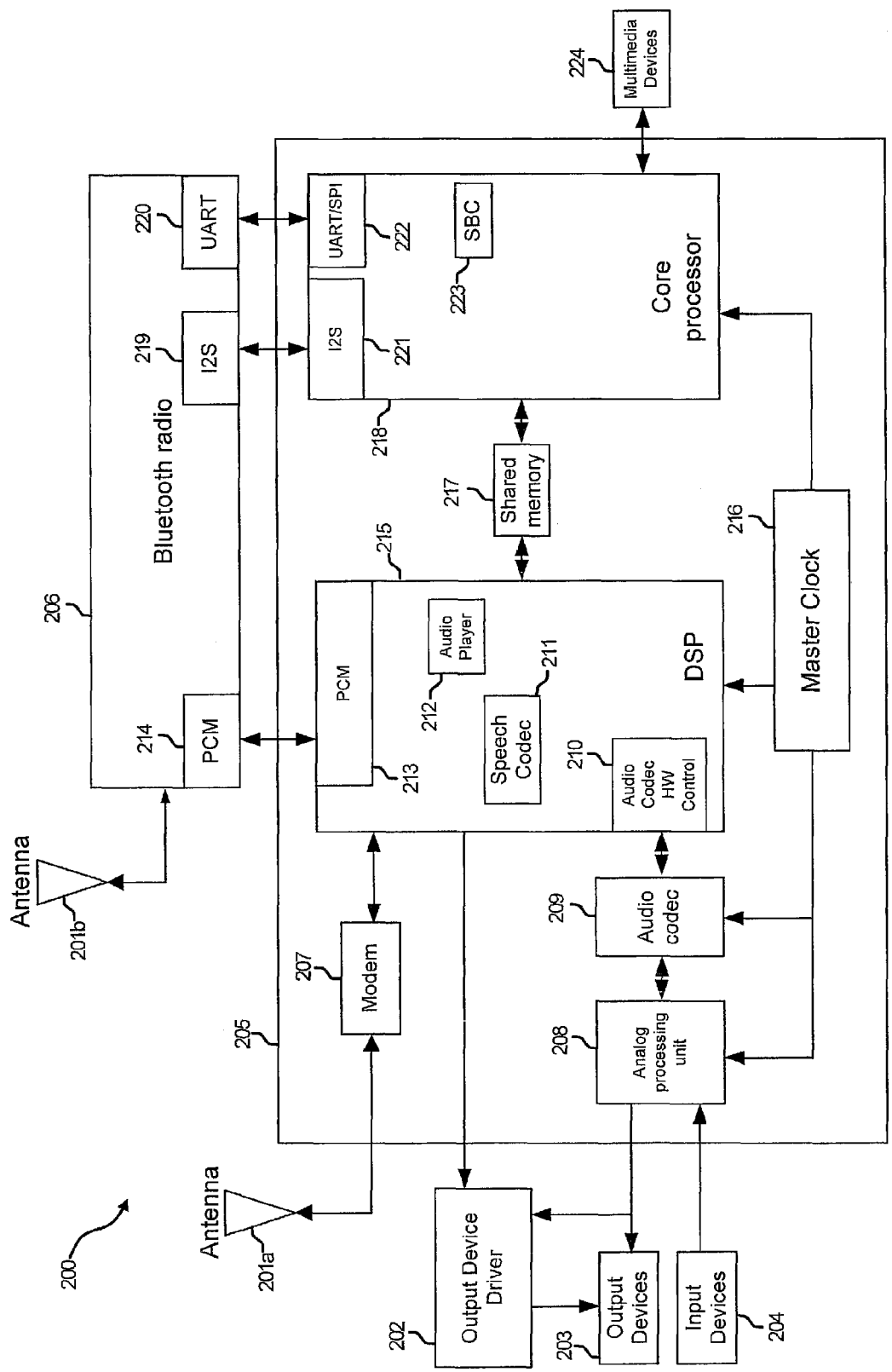
FIG. 2A is a block diagram illustrating an exemplary multimedia baseband processor communicatively coupled to a Bluetooth radio, which may be utilized in connection with an embodiment of the invention.

FIG. 2A is a block diagram illustrating an exemplary multimedia baseband processor communicatively coupled to a Bluetooth radio, which may be utilized in connection with an embodiment of the invention. Referring to FIG. 2A, there is shown a wireless system 200 that may comprise a baseband processor 205, antennas 201a and 201b, a Bluetooth radio 206, an output device driver 202, output devices s203, input devices 204, and multimedia devices 224. The wireless system 200 may comprise similar components as those disclosed for the wireless system 100 in FIG. 1. The baseband processor 205 may comprise a modem 207, a digital signal processor (DSP) 215, a shared memory 217, a core processor 218, a speech coder/decoder unit (codec) 209, an analog processing unit 208, and a master clock 216. The core processor 218 may be, for example, an ARM processor integrated within the baseband processor 205. The DSP 215 may comprise a speech codec 211, an audio player 212, a PCM block 213, and an audio codec hardware control 210. The core processor 218 may comprise an I2S block 221, a UART and serial peripheral interface (UART/SPI) block 222, and a sub-band coding (SBC) codec 223. The Bluetooth radio 206 may comprise a PCM block 214, an I2S block 219, and a UART 220.

The antennas 201a and 210b may comprise suitable logic circuitry, and/or code that may enable wireless signals transmission and/or reception. The output device driver 202 may comprise suitable logic, circuitry, and/or code that may enable controlling the operation of the output devices 203. In this regard, the output device driver 202 may receive at least one signal from the DSP 215 and/or may utilize at least one signal generated by the analog processing unit 208. The output devices 203 may comprise suitable logic, circuitry, and/or code that may enable playing, storing, and/or communicating analog audio, voice, polyringer, and/or mixed signals from the analog processing unit 208. The output devices 203 may comprise speakers, speakerphones, stereo speakers, headphones, and/or storage devices such as audio tapes, for example. The input devices 204 may comprise suitable logic, circuitry, and/or code that may enable receiving of analog audio and/or voice data and communicating it to the analog processing unit 208 for processing. The input devices 204 may comprise one or more microphones and/or auxiliary microphones, for example. The multimedia devices 224 may comprise suitable logic, circuitry, and/or code that may be enable communication of multimedia data with the core processor 218 in the baseband processor 205. The multimedia devices 224 may comprise cameras, video recorders, video displays, and/or storage devices such as memory sticks, for example.

The Bluetooth radio 206 may comprise suitable logic, circuitry, and/or code that may enable transmission, reception, and/or processing of information by utilizing the Bluetooth radio protocol. In this regard, the Bluetooth radio 206 may support amplification, filtering, modulation, and/or demodulation operations, for example. The Bluetooth radio 206 may enable data to be transferred from and/or to the baseband processor 205 via the PCM block 214, the I2S block 219, and/or the UART 220, for example. In this regard, the Bluetooth radio 206 may communicate with the DSP 215 via the PCM block 214 and with the core processor 218 via the I2S block 221 and the UART/SPI block 222.

The modem 207 in the baseband processor 205 may comprise suitable logic, circuitry, and/or code that may enable modulation and/or demodulation of signals communicated via the antenna 201a. The modem 207 may communicate with the DSP 205. The shared memory 217 may comprise suitable logic, circuitry, and/or code that may enable storage of data. The shared memory 217 may be utilized for communicating data between the DSP 215 and the core processor 218. The master clock 216 may comprise suitable logic, circuitry, and/or code that may enable generating at least one clock signal for various components of the baseband processor 205. For example, the master clock 216 may generate at least one clock signal that may be utilized by the analog processing unit 208, the audio codec 209, the DSP 215, and/or the core processor 218, for example.

The core processor 218 may comprise suitable logic, circuitry, and/or code that may enable processing of audio and/or voice data communicated with the DSP 215 via the shared memory 217. The core processor 218 may comprise suitable logic, circuitry, and/or code that may enable processing of multimedia information communicated with the multimedia devices 224. In this regard, the core processor 218 may also control at least a portion of the operations of the multimedia devices 224, such as generation of signals for controlling data transfer, for example. The core processor 218 may also enable communicating with the Bluetooth radio via the I2S block 221 and/or the UART/SPI block 222. The core processor 218 may also be utilized to control at least a portion of the operations of the baseband processor 205, for example. The SBC codec 223 in the core processor may comprise suitable logic, circuitry, and/or code that may enable coding and/or decoding audio signals, such as music or mixed audio data, for example, for communication with the Bluetooth radio 206.

The DSP 215 may comprise suitable logic, circuitry, and/or code that may enable processing of a plurality of audio signals, such as digital general audio data, digital voice data, and/or digital polyringer data, for example. In this regard, the DSP 215 may enable generation of digital polyringer data. The DSP 215 may also enable generation of at least one signal that may be utilized for controlling the operations of, for example, the output device driver 202 and/or the audio codec 209. The DSP 215 may be utilized to communicate processed audio and/or voice data to the core processor 218 and/or to the Bluetooth radio 206. The DSP 215 may also enable receiving audio and/or voice data from the Bluetooth radio 206 and/or from the multimedia devices 224 via the core processor 218 and the shared memory 217.

The speech codec 211 may comprise suitable logic, circuitry, and/or code that may enable coding and/or decoding of voice data. The audio player 212 may comprise suitable logic, circuitry, and/or code that may enable coding and/or decoding of audio or musical data. For example, the audio player 212 may be utilized to process digital audio encoding formats such as MP3, WAV, AAC, uLAW/AU, AIFF, AMR, and MIDI, for example. The audio codec hardware control 210 may comprise suitable logic, circuitry, and/or code that may enable communication with the audio codec 209. In this regard, the DSP 215 may communicate more than one audio signal to the audio codec 209 for processing. Moreover, the DSP 215 may also communicate more than one signal for controlling the operations of the audio codec 209.

The audio codec 209 may comprise suitable logic, circuitry, and/or code that may enable processing audio signals received from the DSP 215 and/or from input devices 204 via the analog processing unit 208. The audio codec 209 may enable utilizing a plurality of digital audio inputs, such as 16 or 18-bit inputs, for example. The audio codec 209 may also enable utilizing a plurality of data sampling rate inputs. For example, the audio codec 209 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio codec 209 may also support mixing of a plurality of audio sources. For example, the audio codec 209 may support at least three audio sources, such as general audio, polyphonic ringer, and voice. In this regard, the general audio and polyphonic ringer sources may support the plurality of sampling rates that the audio codec 209 is enabled to accept, while the voice source may support a portion of the plurality of sampling rates, such as 8 kHz and 16 kHz, for example.

The audio codec 209 may also support independent and dynamic digital volume or gain control for each of the audio sources that may be supported. The audio codec 209 may also support a mute operation that may be applied to each of the audio sources independently. The audio codec 209 may also support adjustable and programmable soft ramp-ups and ramp-down for volume control to reduce the effects of clicks and/or other noises, for example. The audio codec 209 may also enable downloading and/or programming a multi-band equalizer to be utilized in at least a portion of the audio sources. For example, a 5-band equalizer may be utilized for audio signals received from general audio and/or polyphonic ringer sources.

The audio codec 209 may also utilize a programmable infinite impulse response (IIR) filter and/or a programmable finite impulse response (FIR) filter for at least a portion of the audio sources to compensate for passband amplitude and phase fluctuation for different output devices. In this regard, filters coefficients may be configured or programmed dynamically based on current operations. Moreover, filter coefficients may all be switched in one-shot or may be switched sequentially, for example. The audio codec 209 may also utilize a modulator, such as a Delta-Sigma ($\Delta\Sigma$) modulator, for example, to code digital output signals for analog processing.

In operation, the audio codec 209 in the wireless system 200 may communicate with the DSP 215 in order to transfer audio data and control signals. Control registers for the audio codec 209 may reside within the DSP 215. For voice data, the audio samples need not be buffered between the DSP 215 and the audio codec 209. For general audio data and for polyphonic ringer path, audio samples from the DSP 215 may be written into a FIFO and then the audio codec 209 may fetch the data samples. The DSP 215 and the core processor 218 may exchange audio signals and control information via the shared memory 217. The core processor 218 may write PCM audio directly into the shared memory 217. The core processor 218 may also communicate coded audio data to the DSP 215 for computationally intensive processing. In this regard, the DSP 215 may decode the data and may writes the PCM audio signals back into the shared memory 217 for the core processor 218 to access. Moreover, the DSP 215 may decode the data and may communicate the decoded data to the audio codec 209. The core processor 218 may communicate with the audio codec 209 via the DSP 215. Notwithstanding the wireless system 200 disclosed in FIG. 2A, aspects of the invention need not be so limited.

Figure 2B:
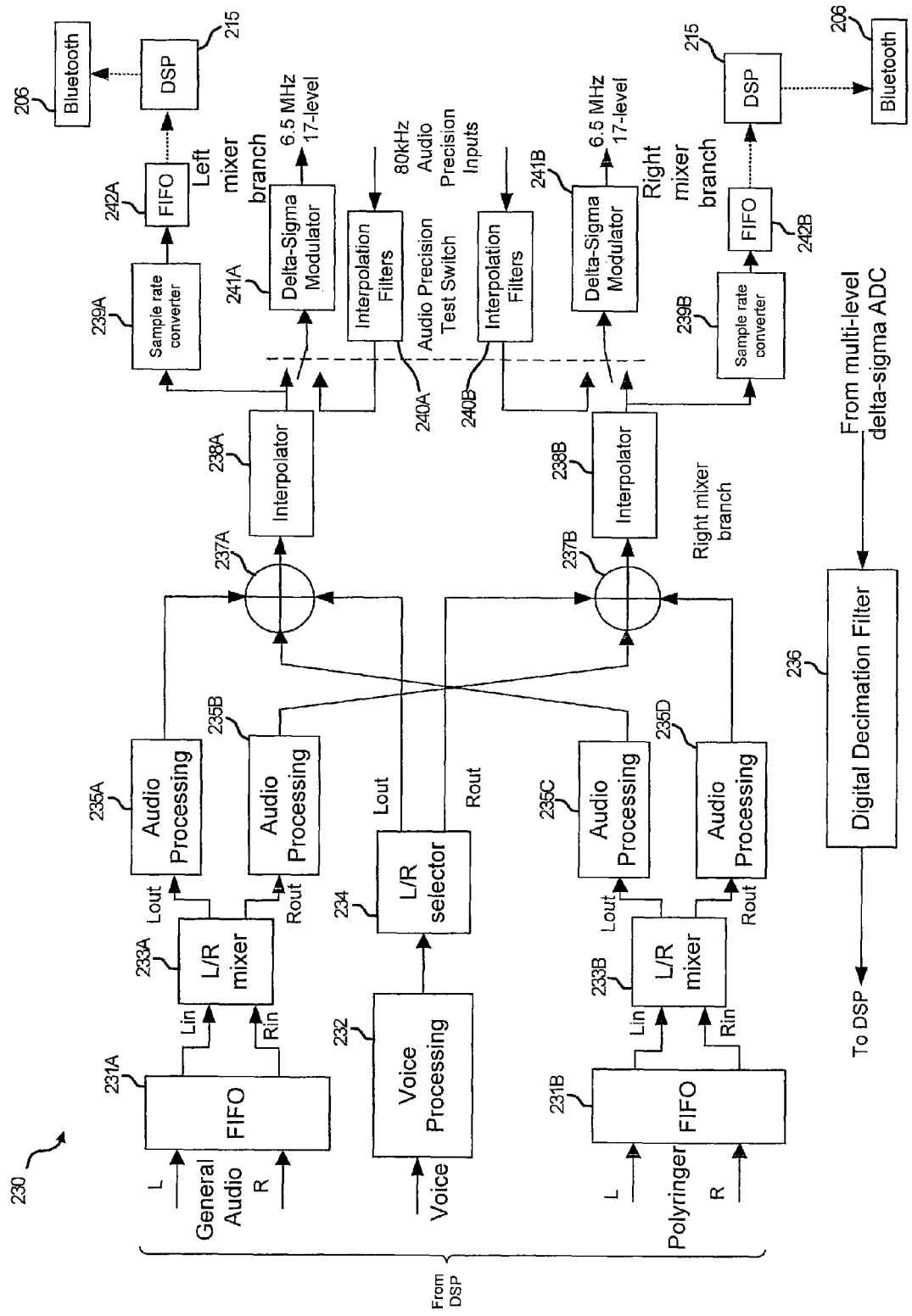
FIG. 2B is a block diagram illustrating an exemplary audio codec in a multimedia baseband processor, which may be utilized in connection with an embodiment of the invention.

FIG. 2B is a block diagram illustrating an exemplary audio codec in a multimedia baseband processor, which may be utilized in connection with an embodiment of the invention. Referring to FIG. 2B, there is shown an audio codec 230 that may correspond to the audio codec 209 disclosed in FIG. 2A. The audio codec 230 may comprise a first portion for communicating data from a DSP, such as the DSP 215, to output devices and/or to a Bluetooth radio, such the output devices 203 and the Bluetooth radio 206. The audio codec 230 may also comprise a second portion that may be utilized for communicating data from input devices, such as the input devices 204, to the DSP 215, for example.

The first portion of the audio codec 230 may comprise a general audio path from the DSP 215, a voice path from the DSP 215, and a polyphonic ringer or polyringer path from the DSP 215. In this regard, the audio codec 230 may utilize a separate processing path before mixing each audio source or audio source type that may be supported. The general audio path may comprise a FIFO 231A, a left and right channels (L/R) mixer 233A, a left channel audio processing block 235A, and a right channel audio processing block 235B. The voice path may comprise a voice processing block 232 and a left and right channels (L/R) selector 234. The polyringer path may comprise a FIFO 231B, an L/R mixer 233B, a left channel audio processing block 235C, and a right channel audio processing block 235D.

Regarding the general audio path and the polyringer path, the FIFOs 231A and 231B may comprise suitable logic, circuitry, and/or code that may enable storage of left and right channels audio signals from general audio source and polyringer source respectively. In this regard, each of the audio signals may be sampled at one of a plurality of sample rates that may be supported by the audio codec 230 for general audio data and/or polyringer data. The L/R mixer 233A may comprise suitable logic, circuitry, and/or code that may enable mixing the input right and left channels from the FIFO 231A to generate mixed left and right channels outputs to the audio processing blocks 235A and 235B respectively. The L/R mixer 233B may comprise suitable logic, circuitry, and/or code that may enable mixing the input right and left channels from the FIFO 231B to generate mixed left and right channels outputs to the audio processing blocks 235C and 235D respectively. The audio processing blocks 235A, 235B, 235C, and 235D may comprise suitable logic, circuitry, and/or code that may enable processing audio signals. In this regard, the audio processing blocks 235A, 235B, 235C, and/or 235D may support equalization operations, compensation operations, rate adaptation operations, and/or volume control operations, for example. The outputs of the audio processing blocks 235A and 235C may be communicated to the left channel branch mixer 237A. The outputs of the audio processing blocks 235B and 235D may be communicated to the right channel branch mixer 237B. The rate adaptation operations enable the outputs of the audio processing blocks 235A, 235B, 235C, and 235D to be at the same sampling rate when communicated to the mixers 237A and 237B.

Regarding the audio voice path, the voice processing block 232 may comprise suitable logic, circuitry, and/or code that may enable processing voice received from the DSP 215 in one of a plurality of voice sampling rates supported by the audio codec 230. In this regard, the voice processing block 232 may support compensation operations, rate adaptation operations, and/or volume control operations, for example. The L/R selector 234 may comprise suitable logic, circuitry, and/or code that may enable separating the voice signal contents into a right channel signal that may be communicated to the mixer 237B and a left channel signal that may be communicated to the mixer 237A. The rate adaptation operation may enable the outputs of the voice processing blocks 232 to be at the same sampling rate as the outputs of the audio processing blocks 235A, 235B, 235C, and/or 235D when communicated to the mixers 237A and 237B. For example, the input signals to the mixers 237A and 237B may be adjusted via up and/or down sampling in the audio processing blocks 235A, 235B, 235C, and 235D and the voice processing block 232 to have the same sampling rates.

The mixer 237A may comprise suitable logic, circuitry, and/or code that may enable mixing the outputs of the audio processing blocks 235A and 235C and the left channel output of the L/R selector 234. The mixer 237B may comprise suitable logic, circuitry, and/or code that may enable mixing the outputs of the audio processing blocks 235B and 235D and the right channel output of the L/R selector 234. The output of the mixer 237A may be associated with the left channel branch of the audio codec 230 while the output of the mixer 237B may be associated with the right channel branch of the audio codec 230. Also associated with the left channel branch may be an interpolator 238A, a sample rate converter 239A, a FIFO 242A, a ΔΣ modulator 241A, and an interpolation filter 240A. Also associated with the right channel branch may be an interpolator 238B, a sample rate converter 239B, a FIFO 242B, a ΔΣ modulator 241B, and an interpolation filter 240B. The interpolation filters 240A and 240B may be optional and may be utilized for testing, for example, to interface to audio testing equipment using the Audio Precision interface or any other interfaces adopted in the industry.

The interpolators 238A and 238B may comprise suitable logic, circuitry, and/or code that may enable up-sampling of the outputs of the mixers 237A and 237B. The sample rate converters 239A and 239B may comprise suitable logic, circuitry, and/or code that may enable adjusting the output signals from the interpolators 238A and 239B to a sampling rate that may be utilized by the DSP 215 and/or the core processor 218 for communication to the Bluetooth radio 206. In this regard, the sample rate converters 239A and 239B may adjust the sampling rates to 44.1 kHz or 48 kHz, for example, for subsequent communication to the Bluetooth radio 206. The sample rate converters 239A and 239B may be implemented as interpolators, such as linear interpolators or more sophisticated decimation filters, for example. The audio and/or voice signal outputs from the sample rate converters 239A and 239B may be communicated to FIFOs 242A and 242B before being communicated to the DSP 215 and/or core processor 218 and later to the Bluetooth radio 206. The ΔΣ modulators 241A and 241B may comprise suitable logic, circuitry, and/or code that may enable modulation of the outputs of the interpolators 238A and 238B to achieve a specified level output signal. For example, the ΔΣ modulators 241A and 241B may receive the 23-bit 6.5 MHz signals from the interpolators 238A and 238B and may reduce the signals levels to generate 6.5 MHz 17-level signals, for example.

The second portion of the audio codec 230 may comprise a digital decimation filter 236. The digital decimation filter 236 may comprise suitable logic, circuitry, and/or code that may enable processing a digital audio signal received from the analog processing unit 208, for example, before communicating the processed audio signal to the DSP 215. The digital decimation filter 236 may comprise FIR decimation filters, CIC decimation filters that may be followed by a plurality of IIR compensation and decimation filters, for example.

Figure 2C:
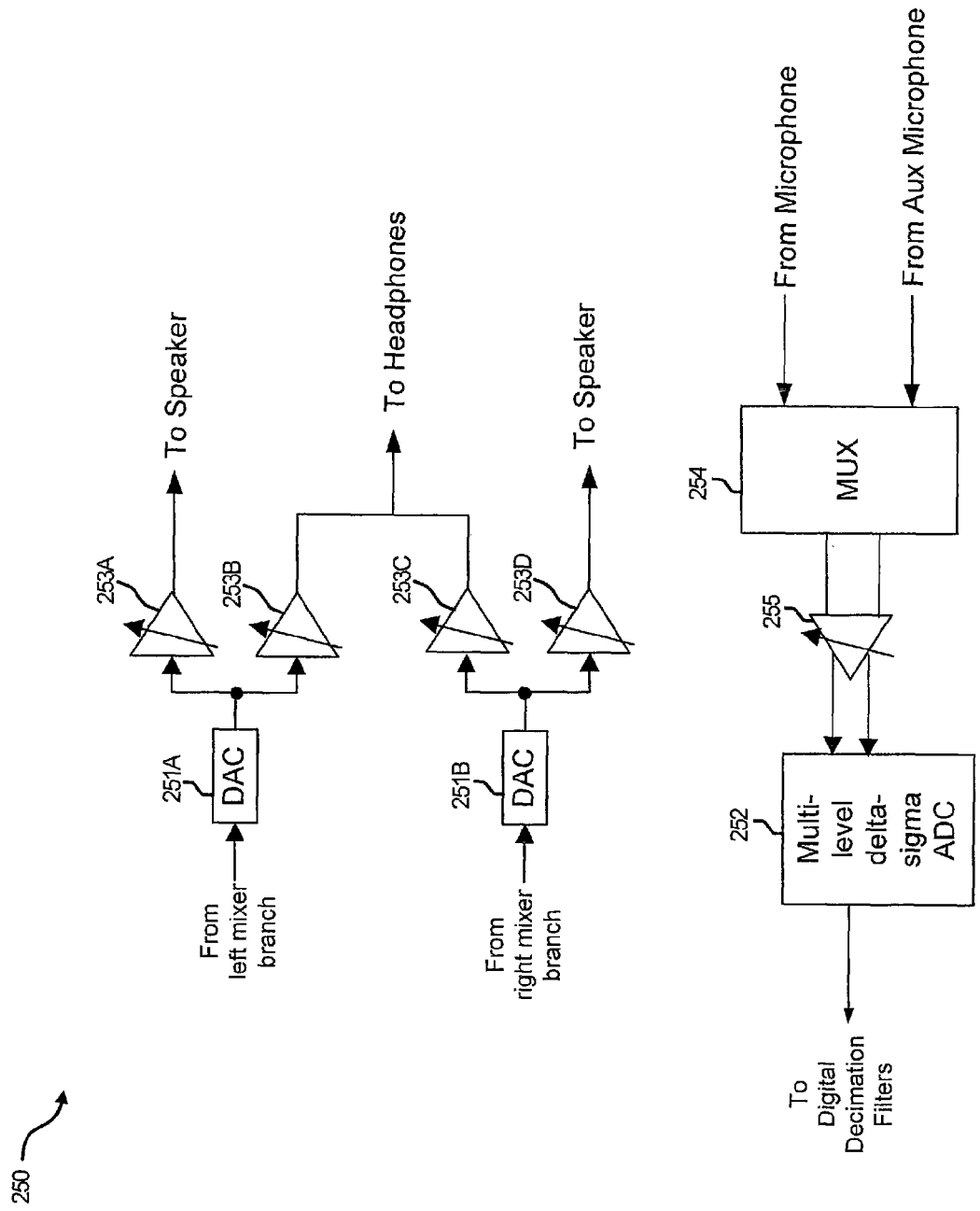
FIG. 2C is a block diagram illustrating an exemplary analog processing unit in a multimedia baseband processor, which may be utilized in connection with an embodiment of the invention.

FIG. 2C is a block diagram illustrating an exemplary analog processing unit in a multimedia baseband processor, which may be utilized in connection with an embodiment of the invention. Referring to FIG. 2C, there is shown an analog processing unit 250 that may correspond to the analog processing unit 208 in FIG. 2A. The analog processing unit 250 may comprise a first portion for digital-to-analog conversion and a second portion for analog-to-digital conversion. The first portion may comprise a first digital-to-analog converter (DAC) 251A and a second DAC 251B that may each comprise suitable logic, circuitry, and/or code that may enable converting digital signals from the left and the right mixer branches in the audio codec 230, respectively, to analog signals. The output of the DAC 251A may be communicated to the variable gain amplifiers 253A and 253B. The output of the DAC 251B may be communicated to the variable gain amplifiers 253C and 253D. The variable gain amplifiers 253A, 253B, 253C, and 253D may each comprise suitable logic, circuitry, and/or code that may enable dynamic variation of the gain applied to their corresponding input signals. The output of the amplifier 253A may be communicated to at least one left speaker while the output of the amplifier 253D may be communicated to at least one right speaker, for example. The outputs of amplifiers 253B and 253D may be combined and communicated to a set of headphones, for example.

The second portion of the analog processing unit 250 may comprise a multiplexer (MUX) 254, a variable gain amplifier 255, and a multi-level Delta-Sigma (ΔΣ) analog-to-digital converter (ADC) 252. The MUX 254 may comprise suitable logic, circuitry, and/or code that may enable selection of an input analog signal from a microphone or from an auxiliary microphone, for example. The variable gain amplifier 255 may comprise suitable logic, circuitry, and/or code that may enable dynamic variation of the gain applied to the analog output of the MUX 254. The multi-level ΔΣ ADC 252 may comprise suitable logic, circuitry, and/or code that may enable conversion of the amplified output of the variable gain amplifier 255 to a digital signal that may be communicated to the digital decimation filter 236 in the audio codec 230 disclosed in FIG. 2B. In some instances, the multi-level ΔΣ ADC 252 may be implemented as a 3-level ΔΣ ADC, for example. Notwithstanding the exemplary analog processing unit 250 disclosed in FIG. 2C, aspects of the invention need not be so limited.

Figure 2D:
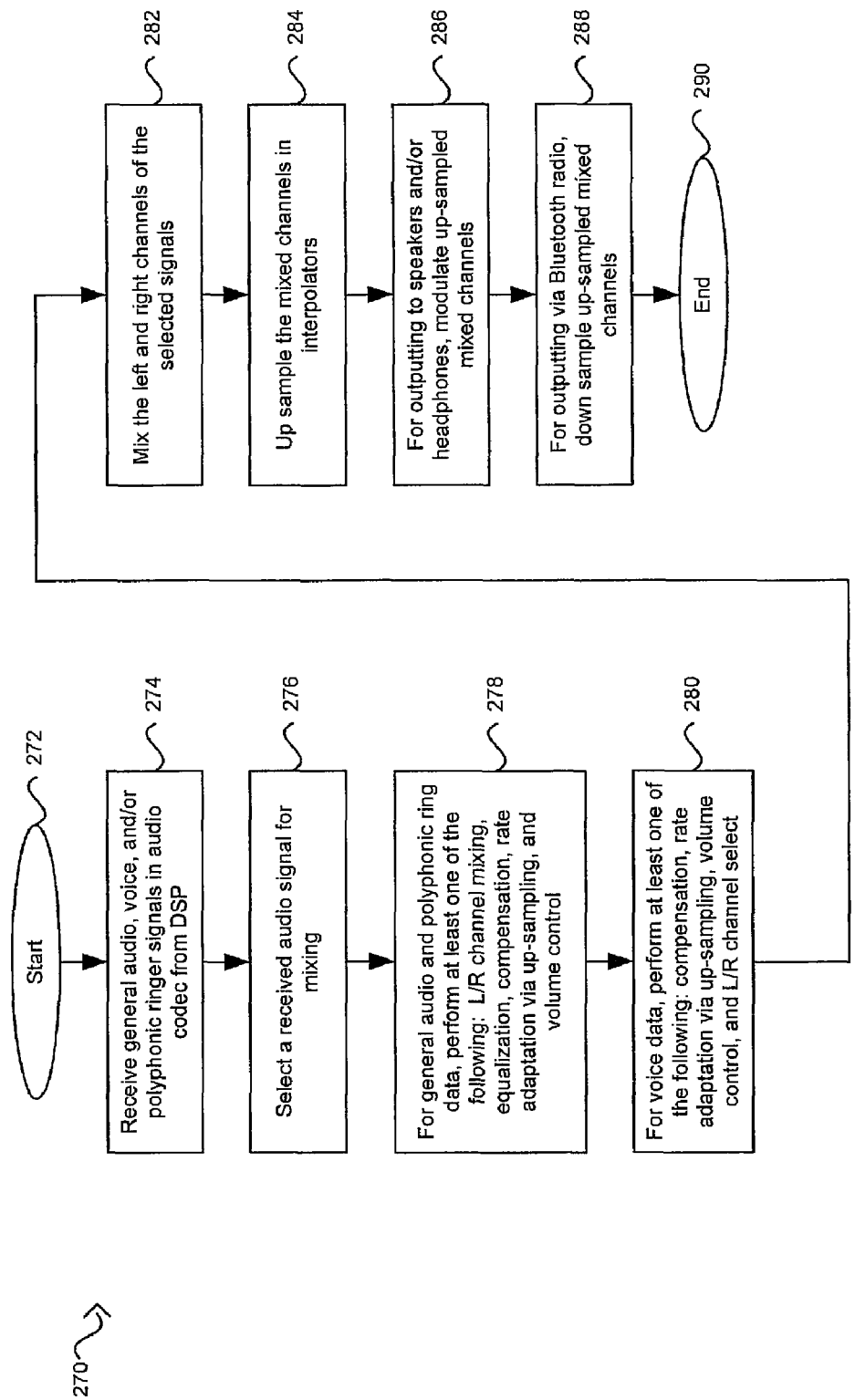
FIG. 2D is a flow diagram illustrating exemplary steps for data mixing in the audio codec, which may be utilized in connection with an embodiment of the invention.

FIG. 2D is a flow diagram illustrating exemplary steps for data mixing in the audio codec, which may be utilized in connection with an embodiment of the invention. Referring to FIG. 2D, there is shown a flow 270. After start step 272, in step 274, the audio codec 230 disclosed in FIG. 2B may receive two or more audio signals from a general audio source, a polyphonic ringer audio source, and/or a voice audio source via the DSP 215, for example. In step 276, the audio codec 230 may be utilized to select two or more of the received audios signals for mixing. In this regard, portions of the audio codec 230 may be programmed, adjusted, and/or controlled to enable selected audio signals to be mixed. For example, a mute operation may be utilized to determine which audio signals may be mixed in the audio codec 230.

In step 278, when the audio signals to be mixed comprises general audio and/or polyphonic ringer audio, the signals may be processed in the audio processing blocks 235A, 235B, 235C, and 235D where equalization operations, compensation operations, rate adaptation operations, and/or volume control operations may be performed on the signals. Regarding the rate adaptation operations, the data sampling rate of the input general audio or polyphonic ringer audio signals may be adapted to a specified sampling rate for mixing. In step 280, when one of the audio signals to be mixed comprises voice, the voice signal may be processed in the voice processing block 232 where compensation operations, rate adaptation operations, and/or volume control operations may be performed on the voice signals. Regarding the rate adaptation operations, the data sampling rate of the input voice signals may be adapted to specified sampling rate for mixing.

In step 282, the left channel general audio and polyringer signals generated by the audio processing blocks 235A and 235C and the left channel voice signals generated by the L/R selector 234 may be mixed in the mixer 237A. Similarly, the right channel general audio and polyringer signals generated by the audio processing blocks 235B and 235D and the right channel voice signals generated by the L/R selector 234 may be mixed in the mixer 237B. In step 284, the outputs of the mixers 237A and 237B corresponding to the mixed left and right channel signals may be up-sampled by the interpolators 238A and 238B respectively. By generating signals with a higher sampling rate after mixing, the implementation of the sample rate converters 239A and 239B may also be simplified.

In step 286, when communicating the up-sampled mixed left and right channels signals to output devices, such as the output devices 203 disclosed in FIG. 2A, the audio codec 230 may utilize the ΔΣ modulators 241A and 241B to reduce the digital audio signals to signals with the much fewer but appropriate levels. In this regard, the output signals may be communicated to the DACs 251A and 251B and to the variable gain amplifiers 253A, 253B, 253C, and 253D disclosed in FIG. 2C for analog conversion and for signal gain respectively. In step 288, when communicating the up-sampled mixed left and right channel signals to the Bluetooth radio 206, the audio codec 230 may down-sample the audio signals by utilizing the sample rate converters 239A and 239B and then communicating the down-sampled signals to the FIFOs 242A and 242B. The DSP 215 may fetch the down-sampled audio signals from the FIFOs 242A and 242B and may then communicate the digital audio signals to the Bluetooth radio 206. Notwithstanding the exemplary steps for mixing audio sources disclosed in FIG. 2D, aspects of the invention need not be so limited.

Figure 3:
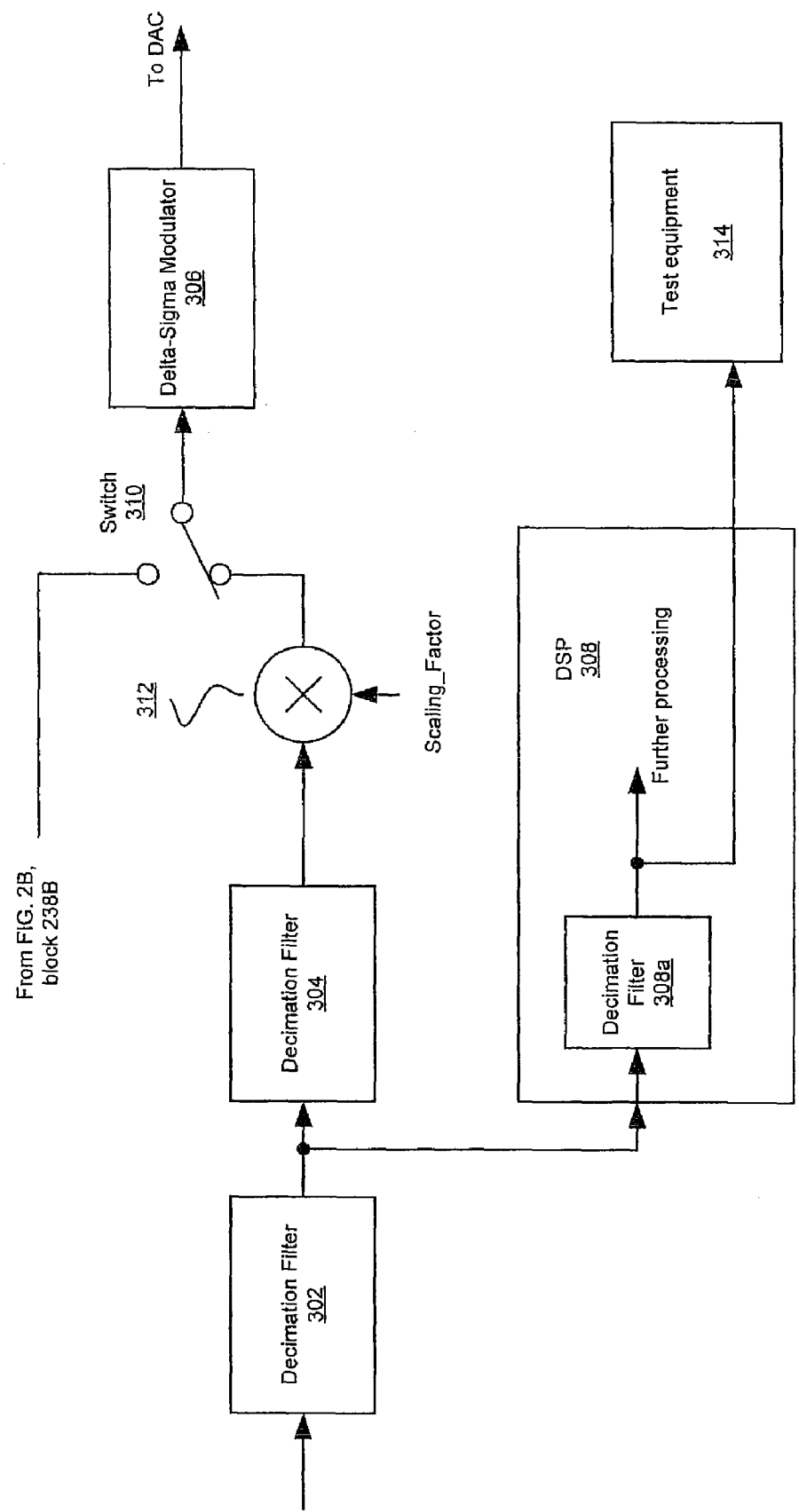
FIG. 3 is a block diagram illustrating exemplary audio CODEC voice ADC processing, in accordance with an embodiment of the invention.

FIG. 3 is a block diagram illustrating exemplary audio CODEC voice ADC processing, in accordance with an embodiment of the invention. Referring to FIG. 3, there is shown decimation filters 302 and 304, a Delta-Sigma (ΔΣ) modulator 306, a digital signal processor (DSP) 308, a switch 310, a scaling block 312, and a test fixture 314. The DSP 308 may comprise, for example, a decimation filter 308a. The decimation filters 302 and 304 may comprise suitable logic, circuitry, and/or code that may enable reducing a frequency of digital samples by a factor of, for example, two. The decimation filters 302 and 304 may also interpolate signal levels of an input digital signal so that the output digital signal may have a greater number of signal levels.

For example, the decimation filter 302 may receive input digital signals with three signal levels, and output digital signals may have nine signal levels. The input signal levels may be assigned, for example, a value of −1, 0, or +1 for each of the three signal levels. Accordingly, the input digital signals may comprise 2 bits for each digital sample. The output signal levels may be assigned, for example, a value of −4, −3, −2, −1, 0, +1, +2, +3, or +4 for each of the nine signal levels. Accordingly, the output digital signals may comprise 4 bits for each digital sample.

Similarly, the decimation filter 304 may receive input digital signals with, for example, nine signal levels, and output digital signals with, for example, thirty-three signal levels. The input signal levels may be represented by the values from −4 . . . +4, and the output signal levels may be represented by values from −16 . . . +16. Accordingly, the input digital signals may comprise 4 bits for each digital sample and the output digital signals may comprise 6 bits for each digital sample.

The ΔΣ modulator 306 may comprise suitable logic, circuitry, and/or code that may enable reduction of digital input levels to achieve a fewer specified level output signal. For example, the ΔΣ modulator 306 may receive 6.5 MHz 33-level, 23-bit signals from the scaling block 312 and may generate 6.5 MHz 17-level, 16-bit signals, for example. The ΔΣ modulator 306 may also remove from the audio band quantization noise that may be due to reducing sample granularity from 23-bit inputs to 16-bit outputs. The DSP 308 may comprise suitable logic, circuitry, and/or code that may enable processing digital signals in preparation for RF transmission. For example, the processing may comprise digital filtering, up-sampling, and/or down-sampling. The decimation filter 308a may comprise suitable logic, circuitry, and/or code that may enable reducing a frequency of digital samples by a factor of, for example, 325. The decimation filter 308a may also interpolate signal levels of an input digital signal so that the output digital signal may have a greater number of signal levels. For example, the input of the decimation filter 308a may comprise a 13 MHz signal with 9 levels for each sample. The output of the signal may comprise a 40 KHz signal with a 17 levels for each sample.

The switch 310 may be used to select either, for example, the output of the decimation filter 304 or the output of the interpolator 238B from FIG. 2B. The switch 310 may be controlled, for example, by baseband processor 102 or the core processor 218. The scaling block 312 may comprise suitable logic, circuitry, and/or code that may allow digital input to be scaled appropriately by a Scaling_Factor. For example, the scaling block 312 may scale the digital signal communicated by the decimation filter 304 by a factor of $2^{17}$. An embodiment of the invention may, for example, left shift the digital input by 17 bits. The result may be a 23-bit output from the scaling block 312. The optional test fixture 314 may comprise suitable logic, circuitry, and/or code that may enable characterizing integrity of input signals.

In operation, the switch 310 may be configured to select the output of the decimation filter 304. The decimation filter 302 may receive 3-bit digital samples at 26 MHz from, for example, the ADC 252. The decimation filter 302 may communicate, for example, 4-bit digital samples at a rate of 13 MHz to the decimation filter 304 and to the DSP 308. The output of the decimation filter 304 may comprise digital signals that indicate, for example, nine signal levels. The decimation filter 304 may process the O-bit digital samples received at a frequency of 13 MHz to generate 6-bit digital samples that may indicate 33 signal levels at a rate of 6.5 MHz.

The output of the decimation filter 304 may be communicated to the scaling block 312. The scaling block 312 may convert the 6-bit digital samples to a 23-bit digital sample. The 23-bit digital samples may be communicated to the ΔΣ modulator 306 via the switch 310. The output of the ΔΣ modulator 306 may be communicated to, for example, the DAC 251A and/or 251B, which may generate an analog signal that may be, for example, communicated to the output devices 203, which may be, for example, headphone, speakers, and/or test devices for loop-back mode testing. The O-bit digital samples from the decimation filter 302 may also be communicated to the DSP 308 at a rate of 13 MHz. The decimation filter 308a may process the input signal to generate a 40 KHz, 17-bit signal. The DSP 308 may further process the 40 KHz, 17-bit signal for RF transmission by, for example, at least one of the plurality of RF subsystems 104, . . . , 106. The 40 KHz, 17-bit signal may also be communicated to, for example, the test fixture 314 for testing purposes of the digital signal. The test fixture 314 may utilize the Audio Precision interface or any other interface used by the industry.

Figure 4A:
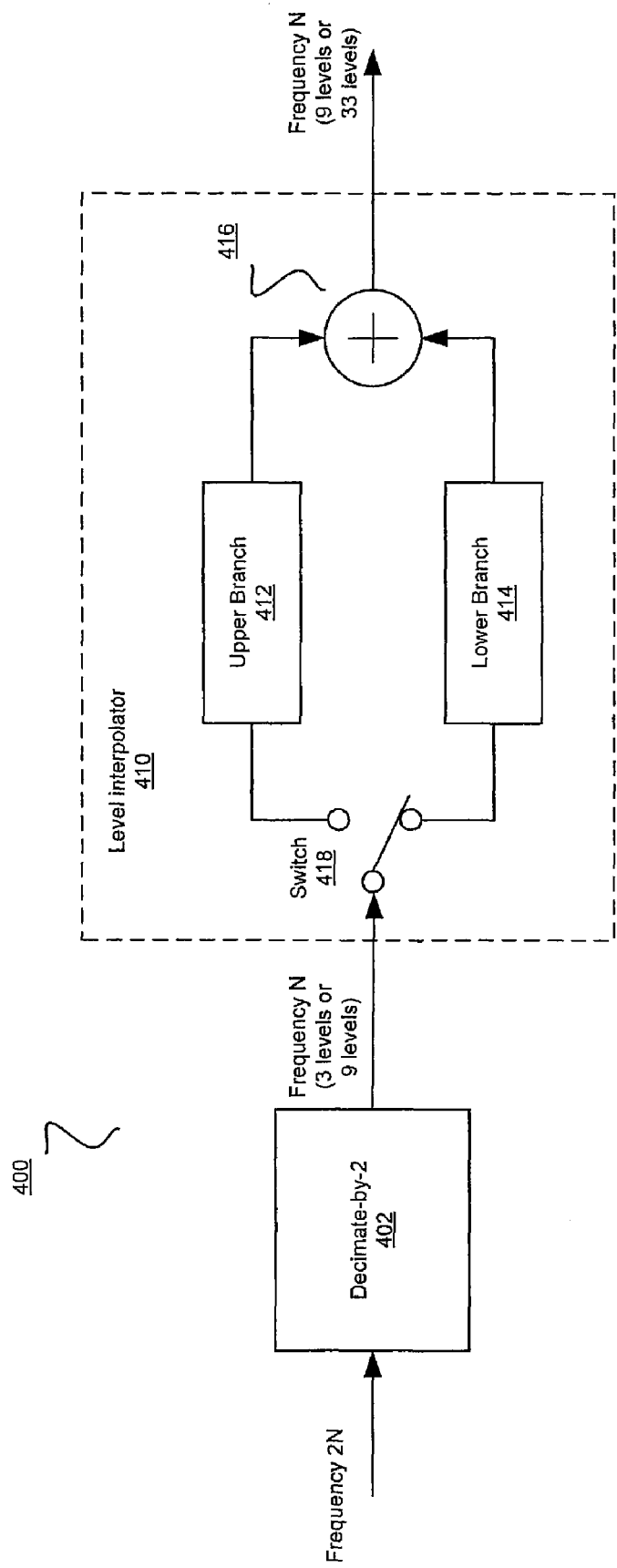
FIG. 4A is a block diagram illustrating exemplary decimation filter that interpolates signal levels, in accordance with an embodiment of the invention.

FIG. 4A is a block diagram illustrating exemplary decimation filter that interpolates signal levels, in accordance with an embodiment of the invention. Referring to FIG. 4A, there is shown a decimation filter 400, such as, for example, the decimation filter 302 or 304. The decimation filter 400 may comprise the decimation block 402 and the level interpolator block 410. The level interpolator block 410 may comprise signal level interpolation blocks 412 and 414, a combiner block 416 and a switch 418.

The decimator block 402 may comprise suitable logic, circuitry, and/or code that may enable decimation of an input digital signal to generate a digital signal at one-half the sample rate. For example, if the decimator block 402 receives digital samples at a rate of 26 MHz or 13 MHz, the output of the decimator block 402 may be digital samples at a rate of 13 MHz or 6.5 MHz. The number of bits per sample may be the same for the input of the decimator block 402 as for the output of the decimator block 402.

The signal level interpolation blocks 412 and 414 may receive input via the switch 418. For example, the switch 418 may communicate a digital sample to the signal level interpolation block 412, and then switch to the signal level interpolation block 414 to communicate a next digital sample to the signal level interpolation block 414. Accordingly, an exemplary embodiment of the invention may communicate, for example, every other sample to one of the signal level interpolation blocks 412 and 414 and remaining samples to the other of the signal level interpolation blocks 412 and 414. The signal level interpolation blocks 412 and 414 may process a presently received digital sample with a previously received digital sample to generate outputs. The outputs of the signal level interpolation blocks 412 and 414 may be combined by the combiner block 416 to generate a 4-bit 13 MHz digital sample that may comprise 9 levels, or a 6-bit 6.5 MHz digital sample that may comprise 33 levels.

Figure 4B:
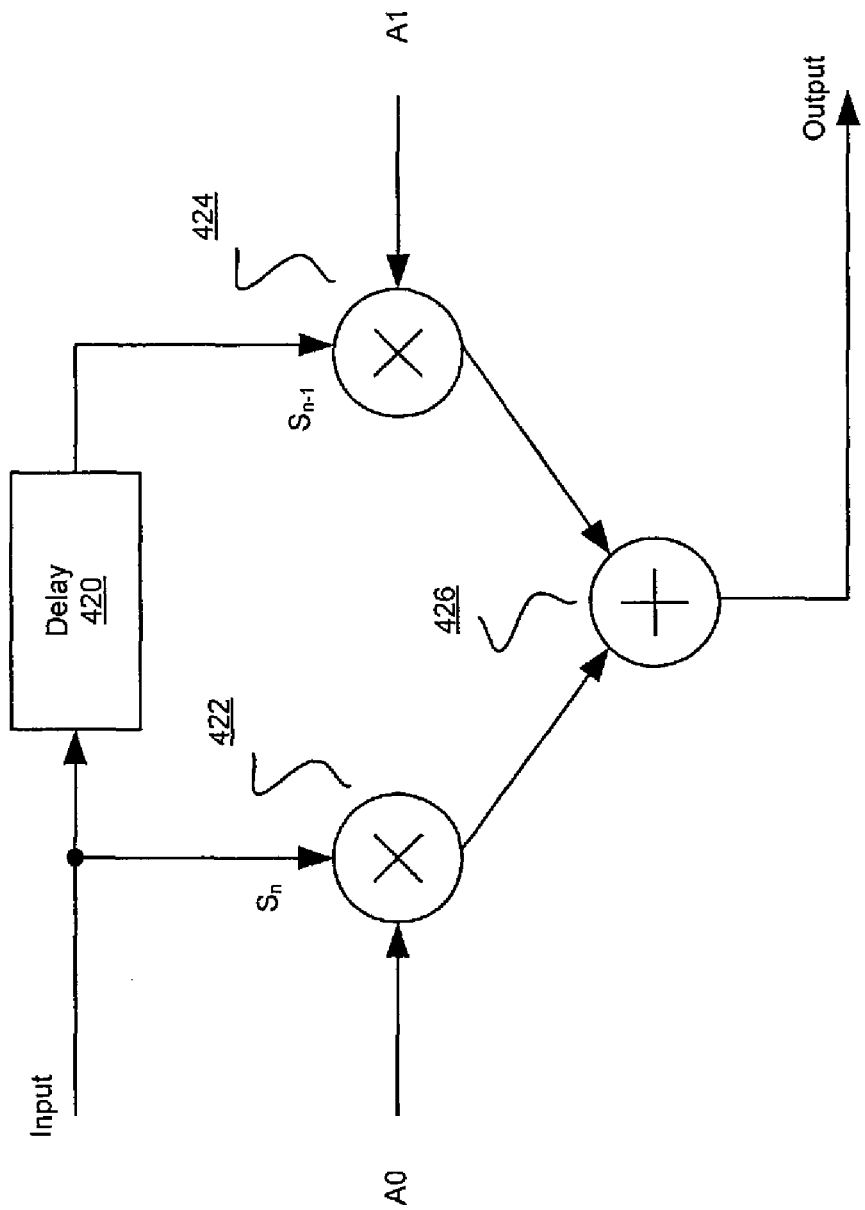
FIG. 4B is a block diagram illustrating exemplary circuitry that interpolates signal levels, in accordance with an embodiment of the invention.

FIG. 4B is a block diagram illustrating exemplary circuitry that interpolates signal levels, in accordance with an embodiment of the invention. Referring to FIG. 4B, there is shown a delay bock 420, multiplier blocks 422 and 424, and a combiner block 426. The delay block 420 may comprise suitable logic, circuitry, and/or code that may enable delaying an input signal by a sample period. The sample period may be the time period between successive input digital samples. Accordingly, the delay block 420 may delay an input signal such that the delay block 420 may output a (N−1)st digital sample when a Nth digital sample is communicated to the input of the delay block 420.

The multiplier blocks 422 and 424 may each comprise suitable logic, circuitry, and/or code that may enable multiplication of a first input to the multiplier block with a second input to the multiplier block. For example, the multiplier block 422 may multiply an input $S_n$ with a multiplication factor A0, and the multiplier block 424 may multiply an input $S_{n-1}$ with a multiplication factor A1 at a similar time frame. Accordingly, if the multiplication factor A0 is "1," the output of the multiplier block 422 may be the same as the input of the multiplier block 422. If the multiplication factor ΔΣ is "2", the output of the multiplier block 424 may be twice the input of the multiplier block 424. For example, for the inputs "−1, 0, +1," the output of the multiplier block 424 may be "−2, 0, +2." The combiner block 426 may combine the outputs of the multiplier blocks 422 and 424.

In operation, if the input to the delay block 420 and the multiplier block 422 comprises the values "−1, 0, +1, −1" at time instances $S_{n-3}$, $S_{n-2}$, $S_{n-1}$, and $S_n$, the output of the delay block may be "−1, 0, +1" at time instances $S_{n-2}$, $S_{n-1}$, and $S_n$. Accordingly, the input to the multiplier blocks 422 and 424 may be "0, +1, −1" and "−1, 0, +1," respectively, at time instances $S_{n-2}$, $S_{n-1}$, and $S_n$. The outputs of the multiplier blocks 422 and 424 may be "0, +1, −1" and "−2, 0, +2," respectively, at time instances $S_{n-2}$, $S_{n-1}$, and $S_n$. Accordingly, the output of the combiner block 426 may be "−2, +1, +1," respectively, at time instances $S_{n-2}$, $S_{n-1}$, and $S_n$.

FIG. 5 is an exemplary illustration for interpolating 9 signal levels from 3 signal levels, in accordance with an embodiment of the invention. Referring to FIG. 5, there is shown 3-level inputs at consecutive time instances $S_n$ and $S_{n-1}$. There is also shown an upper branch signal level interpolation block 412 multiplication factors A0=1 and A1=1, and an output OUT0 of the upper branch signal level interpolation block 412. There is further shown a lower branch signal level interpolation block 414 multiplication factors A0=0 and A1=2, and an output OUT1 of the lower branch signal level interpolation block 414. There is additionally shown an output of the combiner block 416, which may be, for example, OUT0+OUT1.

There may also be shown input examples 502 . . . 518 where each input example may refer to a specific pattern of the 3-level inputs at time instances $S_n$ and $S_{n-1}$. With respect to the input example 502, the 3-level inputs may be [−1, −1] at time instances [$S_n$, $S_{n-1}$]. The multiplication factors A0=1 and A1=1 may be used for the 3-level inputs of the upper branch signal level interpolation block 412 at time instance $S_n$ and $S_{n-1}$, respectively. The multiplication factors A0=0 and A1=2 may be used for the 3-level inputs of the upper branch signal level interpolation block 414 at time instance $S_n$ and $S_{n-1}$, respectively. Accordingly, the output of the upper branch signal level interpolation block 412 at time instance $S_n$ may be −2. Similarly, the output of the lower branch signal level interpolation block 412 at time instance $S_n$ may be −2. The output of the combiner block 416, which may be OUT0+OUT1, may be a signed 4-bit output that may represent the signed integer −4.

Similarly, the input example 504 with the inputs [−1, 0] may result in a 4-bit output of −1. The input example 506 with the inputs [−1, +1] may result in a 4-bit output of +2. The input example 508 with the inputs [0, −1] may result in a 4-bit output of −3. The input example 510 with the inputs [0, 0] may result in a 4-bit output of 0. The input example 512 with the inputs [0, +1] may result in a 4-bit output of +3. The input example 514 with the inputs [+1, −1] may result in a 4-bit output of −2. The input example 516 with the inputs [+1, 0] may result in a 4-bit output of +1. The input example 518 with the inputs [+1, +1] may result in a 4-bit output of +4. Accordingly, the 2-bit 3-level input to the level interpolator 410 may result in a 4-bit 9-level output where the level may range from −4 to +4.

FIG. 6 is an exemplary illustration for interpolating 33 signal levels from 9 signal levels, in accordance with an embodiment of the invention. Referring to FIG. 6, there is shown 9-level inputs at consecutive time instances $S_n$ and $S_{n-1}$. There is also shown an upper branch signal level interpolation block 412 multiplication factors A0=1 and A1=1, and an output OUT0 of the upper branch signal level interpolation block 412. There is further shown a lower branch signal level interpolation block 414 multiplication factors A0=0 and A1=2, and an output OUT1 of the lower branch signal level interpolation block 414. There is additionally shown an output of the combiner block 416, which may be, for example, OUT0+OUT1.

There may also be shown input examples 602 . . . 634 where each input example may refer to a specific pattern of the 9-level inputs at time instances $S_n$ and $S_{n-1}$. With respect to the input example 602, the 9-level inputs may be [−4, −4] at time instances [$S_n$, $S_{n-1}$]. The multiplication factors A0=1 and A1=1 may be used for the 9-level inputs of the upper branch signal level interpolation block 412 at time instance $S_n$ and $S_{n-1}$, respectively. The multiplication factors A0=0 and A1=2 may be used for the 9-level inputs of the upper branch signal level interpolation block 414 at time instance $S_n$ and $S_{n-1}$, respectively. Accordingly, the output of the upper branch signal level interpolation block 412 at time instance $S_n$ may be −8. Similarly, the output of the lower branch signal level interpolation block 412 at time instance $S_n$ may be −8. The output of the combiner block 416, which may be OUT0+OUT1, may be a signed 6-bit output that may represent the signed integer −16.

Similarly, the input example 604 with the inputs [−4, −3] may result in a G-bit output of −13. The input example 606 with the inputs [−4, −2] may result in a 6-bit output of −10. The input example 608 with the inputs [−4, −1] may result in a 6-bit output of −7. The input example 610 with the inputs [−4, 0] may result in a 6-bit output of −4. The input example 612 with the inputs [−4, +1] may result in a 6-bit output of −1. The input example 614 with the inputs [−4, +2] may result in a 6-bit output of +2. The input example 616 with the inputs [−4, +3] may result in a 6-bit output of +5. The input example 618 with the inputs [−4, +4] may result in a 6-bit output of +8.

In a similar manner, the input example 620 may comprise an input of −3 to the level interpolator 410 at time instance Sn, the input at time instance Sn−1 may vary from −4 to +4, and the output of the level interpolator 410 may be −15, −12, −9, −6, −3, 0, +3, +6, or +9, respectively. The input example 622 may comprise an input of −2 to the level interpolator at time instance Sn, the input at time instance Sn−1 may vary from −4 to +4, and the output of the level interpolator 410 may be −14, −11, −8, −5, −2, +1, +4, +7, or +10, respectively. The input example 624 may comprise an input of −1 to the level interpolator 410 at time instance Sn, the input at time instance Sn−1 may vary from −4 to +4, and the output of the level interpolator 410 may be −13, −10, −7, −4, −1, +2, +5, +8, or +11, respectively. The input example 626 may comprise an input of 0 to the level interpolator 410 at time instance Sn, the input at time instance Sn−1 may vary from −4 to +4, and the output of the level interpolator 410 may be −12, −9, −6, −3, 0, +3, +6, +9, or +12, respectively.

The input example 628 may comprise an input of +1 to the level interpolator at time instance Sn, the input at time instance Sn−1 may vary from −4 to +4, and the output of the level interpolator 410 may be −11, −8, −5, −2, +1, +4, +7, +10, or +13, respectively. The input example 630 may comprise an input of +2 to the level interpolator at time instance Sn, the input at time instance Sn−1 may vary from −4 to +4, and the output of the level interpolator 410 may be −10, −7, −4, −1, +2, +5, +8, +11, or +14, respectively. The input example 632 may comprise an input of +3 to the level interpolator 410 at time instance Sn, the input at time instance Sn−1 may vary from −4 to 4, and the output of the level interpolator 410 may be −9, −6, −3, 0, +3, +6, +9, +12, or +15, respectively. The input example 634 may comprise an input of +4 to the level interpolator 410 at time instance Sn, the input at time instance Sn−1 may vary from −4 to +4, and the output of the level interpolator 410 may be −8, −5, −2, +1, +4, +7, +10, +13, or +16, respectively. Accordingly, the 4-bit 9-level input to the level interpolator 410 may result in a 6-bit 33-level output where the level may range from −16 to +16.

Figure 7:
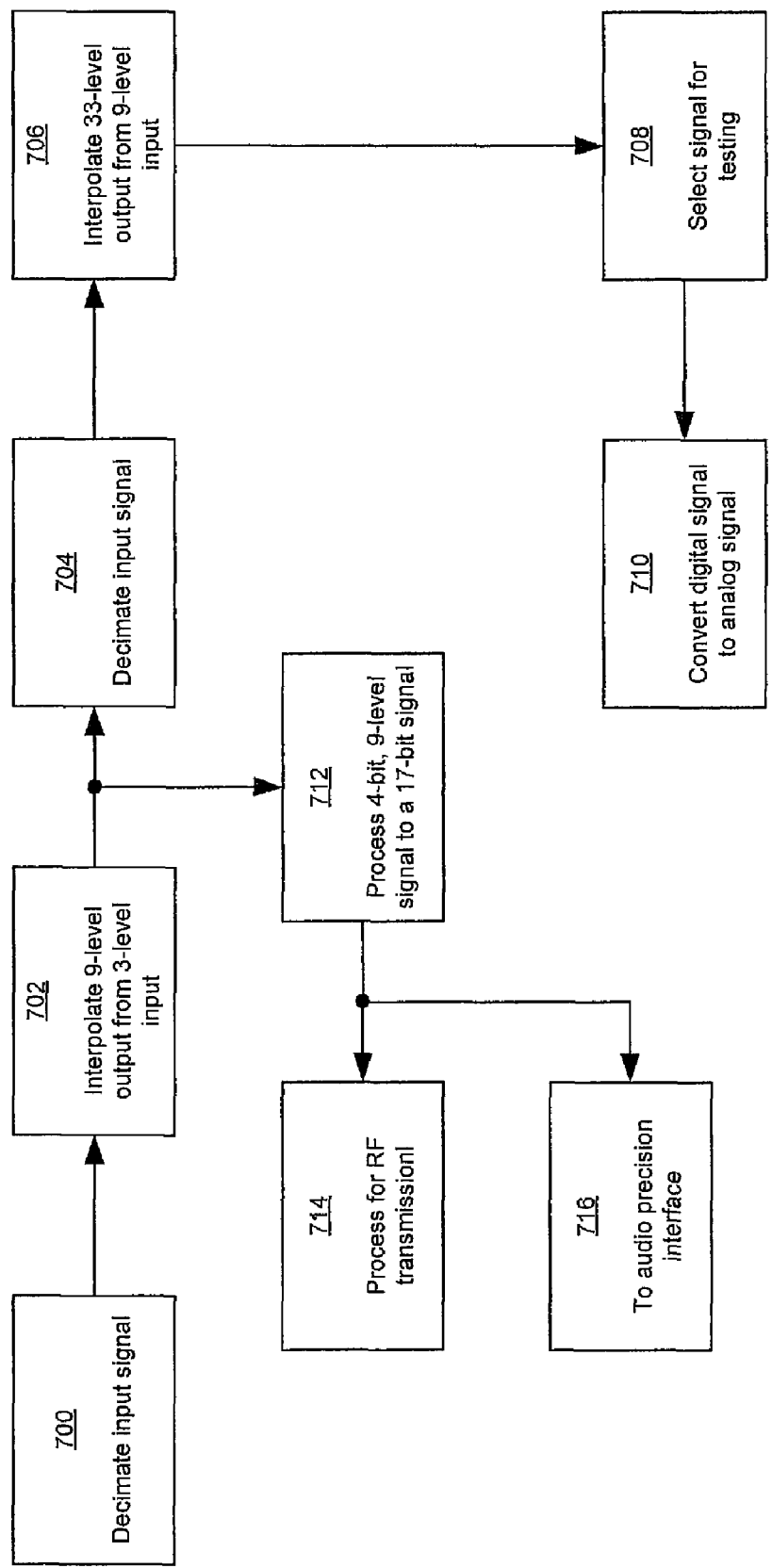
FIG. 7 is an exemplary flow diagram for voice ADC processing, in accordance with an embodiment of the invention.

FIG. 7 is an exemplary flow diagram for voice ADC processing, in accordance with an embodiment of the invention. Referring to FIG. 7, there is shown steps 700 to 716. In step 700, a digital signal may be received by the decimating filter 302, from, for example, the multi-level ΔΣ ADC 252. The digital signal may comprise, for example, a sample frequency of 26 MHz at 2 bits per sample, where each sample may indicate one of 3 levels. The decimating filter 302 may enable decimation of the digital signal to a sample rate of 13 MHz. In step 702, the decimating filter 302 may also interpolate the 2-bit samples to generate 4-bit samples, where each of the 4-bit samples may indicate one of nine levels. The next step may be step 704 and step 712.

In step 704, the output digital signal from the decimating filter 302 may be communicated to the decimating filter 304. The decimating filter 304 may decimate the 13 MHz samples to generate 6.5 MHz samples. In step 706, the decimating filter 304 may interpolate the 4-bit samples to generate 6-bit samples, where each of the 6-bit samples may indicate one of 33 levels. The 6-bit output of the decimating filter 304 may be, for example, left shifted by 17 bits by the scaling block 312 to form 23-bit words. The 23-bit words may be communicated to the switch 310. In step 708, the switch 310 may, for example, select the data from the scaling block 312 to communicate to the ΔΣ modulator 306. In step 710, the ΔΣ modulator 306 may convert, for example, the 23-bit data to a 17-level, 16-bit data. The ΔΣ modulator 306 may also remove quantization noise that may have been generated by converting, for example, 23-bit data to 16-bit data.

In step 712, the 13 MHz samples at 4-bits per sample may be communicated to the DSP 308. The decimation filter 308a, which may be, for example, a type of cascaded integrator-comb (CIC) filter, may decimate and process the 13 MHz, 4-bit samples to 40 KHz, 17-bit samples. The next steps may be steps 714 and 716. In step 714, the 40 KHz, 17-bit samples may be further processed for transmission as RF signals by, for example, the DSP 308, the TX DACs 120 . . . 126, and the RF subsystems 104 . . . 106a. In step 716, the 17-bit samples may be communicated to, for example, the test fixture 314 that may be used to measure the output signal and to determine whether a signal may be acceptable. Acceptability criteria may be design and/or implementation dependent.

In accordance with an embodiment of the invention, aspects of an exemplary system may comprise the decimating filter 302 that decimates a 26 MHz, 3-level digital input signal by two. The resulting 13 MHz, 3-level digital input signal may be further processed by the decimating filter 302 to generate a 13 MHz, 9-level digital signal, where the 9-level digital signal may comprise 4 bits. The 13 MHz, 9-level digital signal may be communicated to the DSP 308, which may generate a 40 KHz, 17-bit signal from the 13 MHz, 9-level digital signal. The DSP 308 may further process the 40 KHz, 17-bit signal for processing via, for example, at least one of the transmit DACs 120, . . . , 126, and at least one of the RF subsystems 104, . . . , 106 for RF transmission. The DSP 308 may also communicate the 40 KHz, 17-bit signal to the test equipment 314 for testing purposes, for example, while the wireless system 100 may be operating.

The 13 MHz, 9-level digital signal may also be communicated to, for example, the decimating filter 304 that may generate a 6.5 MHz, 33-level digital output signal. The 6.5 MHz, 33-level digital output signal may be communicated to the ΔΣ modulator 306. The output of the ΔΣ modulator 306 may be communicated to the DAC 251A and/or the DAC 251B. The DACs 251A and 251B may generate analog signals that may be processed to be output by, for example, the output devices 203. The output devices 203 may comprise, for example, speakers, headphones, and/or test devices. Accordingly, the analog signals may be used for testing purposes while, for example, the wireless system 100 may be operating.

Another embodiment of the invention may provide a machine-readable storage, having stored thereon, a computer program having at least one code section executable by a machine, thereby causing the machine to perform the steps as described above for audio CODEC voice ADC processing.

While specific embodiments of the invention may have been described for exemplary purposes, the invention need not be limited so. For example, various embodiments of the invention may be used for interpolating digital signals with different number of signal levels. The frequencies of signals received and output by the various decimation filters may be different, depending on design and/or implementation decisions. Also, functionalities may be grouped to different functional blocks than the exemplary descriptions in this application. For example, while the decimation filters 302 and 304 may have been described as comprising the functionalities of decimation and signal level interpolation, those functionalities may be separated to two different functional circuits. An example may be where a decimation block may decimate and a separate interpolation block may interpolate signal levels.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. One or more circuits, comprising:
    an audio codec;
    a digital signal processor (DSP) operatively coupled to the audio codec;
    a second processor; and
    a memory that is shared by at least the second processor and the DSP,
    wherein the one or more circuits are configured to support multiple wireless communication protocols and multiple antennas,
    wherein the one or more circuits are configured to support separate processing paths for at least a general audio path, a voice path and a polyphonic ringer path before mixing the supported, separate processing paths,
    wherein the one or more circuits are configured to decimate a multi-level digital input signal by M, where M is an integer that is greater than or equal to 2, and
    wherein the one or more circuits are configured to generate an output digital signal having a number of signal levels greater than the multi-level digital input signal by processing the decimated multi-level digital input signal.

2. The one or more circuits according to claim 1, wherein the multi-level digital input signal includes digital samples at a rate of 26 mega-samples per second.

3. The one or more circuits according to claim 1, wherein the multi-level digital input signal includes at least three signal levels.

4. The one or more circuits according to claim 1, wherein the output digital signal includes at least nine signal levels.

5. The one or more circuits according to claim 1, wherein the one or more circuits are configured to process the output digital signal for one or more of the following: testing, audio output and RF transmission.

6. The one or more circuits according to claim 1, wherein the one or more circuits are configured to decimate the output digital signal by N, where N is an integer that is greater than or equal to 2.

7. The one or more circuits according to claim 1, wherein the one or more circuits support one or more of the following: Bluetooth, WCDMA, HSDPA, GSM, GPRS and EDGE.

8. The one or more circuits according to claim 1, wherein the one or more circuits are configured to convert a signal rate of the multi-level input digital signal, and wherein the converted signal rate is converted to an analog signal for communication to one or more of the following: an output device and a test fixture.

9. The one or more circuits according to claim 1, wherein the one or more circuits are operatively coupled to a Bluetooth subsystem and to one or more of the following: a WCDMA subsystem and a GSM subsystem.

10. The baseband processor one or more circuits according to claim 1, wherein the second processor comprises an ARM processor, or wherein the DSP comprises a speech codec.

11. The one or more circuits according to claim 1, wherein the one or more circuits include one or more of the following: a graphics accelerator, an MPEG accelerator and a JPEG accelerator.

12. The one or more circuits according to claim 1, wherein the one or more circuits are operatively coupled to an input device and to an output device, wherein the input device includes one or more of the following: a microphone, an auxiliary microphone, a camera, a video recorder and a keypad, and wherein the output device includes one or more of the following: a speaker, a speakerphone, stereo speakers, headphones and a display.

13. The one or more circuits according to claim 1, wherein the audio codec is configured to support a plurality of digital audio inputs, wherein the audio codec is configured to support digital audio signals at a plurality of sampling rates.

14. A wireless communication system, comprising:
    a one or more circuits that include an audio codec, a digital signal processor (DSP), a core second processor and a memory, wherein the DSP is operatively coupled to the audio codec, wherein the memory is shared by at least the second processor and the DSP,
    wherein the one or more circuits are configured to support multiple wireless communication protocols and multiple antennas,
    wherein the one or more circuits are configured to support separate processing paths for at least a general audio path, a voice path and a polyphonic ringer path before mixing the supported, separate processing paths,
    wherein the one or more circuits are configured to decimate a multi-level digital input signal by M, where M is an integer that is greater than or equal to 2, and
    wherein the one or more circuits are configured to generate an output digital signal having a number of signal levels greater than the multi-level digital input signal by processing the decimated multi-level digital input signal.

15. The one or more circuits according to claim 14, wherein the Bluetooth subsystem comprises a Bluetooth radio that is integrated on a single chip.

16. The system according to claim 15, wherein the one or more circuits are operatively coupled to a Bluetooth subsystem and to one or more of the following: a WCDMA subsystem and a GSM subsystem.

17. The system according to claim 15, wherein the one or more circuits support one or more of the following: Bluetooth, WCDMA, HSDPA, GSM, GPRS and EDGE.

18. The system according to claim 15, wherein the Bluetooth subsystem comprises a Bluetooth radio that is integrated on a single chip, wherein the second processor comprises an ARM processor, or wherein the DSP comprises a speech codec.

19. The system according to claim 15,
    wherein the one or more circuits include one or more of the following: a graphics accelerator, an MPEG accelerator and a JPEG accelerator, or
    wherein the one or more circuits are operatively coupled to an input device and to an output device, wherein the input device includes one or more of the following: a microphone, an auxiliary microphone, a camera, a video recorder and a keypad, and wherein the output device includes one or more of the following: a speaker, a speakerphone, stereo speakers, headphones and a display.

20. A mobile wireless communication device, comprising:
    one or more circuits that include an audio codec, a digital signal processor (DSP), a second processor and a memory, wherein the DSP is operatively coupled to the audio codec, wherein the memory is shared by at least the second processor and the DSP, wherein the one or more circuits are configured to support multiple wireless communication protocols and multiple antennas, wherein the one or more circuits are configured to support separate processing paths for at least a general audio path, a voice path and a polyphonic ringer path before mixing the supported, separate processing paths, wherein the one or more circuits are configured to decimate a multi-level digital input signal by M, where M is an integer that is greater than or equal to 2, wherein the one or more circuits are configured to generate an output digital signal having a number of signal levels greater than the multi-level digital input signal by processing the decimated multi-level digital input signal, and wherein the supports one or more circuits support at least two of the following: Bluetooth, WCDMA, HSDPA, GSM, GPRS and EDGE.

* * * * *

UNITED STATES PATENT AND TRADEMARK OFFICE
CERTIFICATE OF CORRECTION

| | | |
|---|---|---|
| PATENT NO. | : 8,169,344 B2 | Page 1 of 1 |
| APPLICATION NO. | : 13/096290 | |
| DATED | : May 1, 2012 | |
| INVENTOR(S) | : Kong et al. | |

It is certified that error appears in the above-identified patent and that said Letters Patent is hereby corrected as shown below:

Column 17
Line 56, Claim 10, please replace "baseband processor one or more circuits" with --one or more circuits--.

Column 18
Line 11, Claim 14, please replace "a one or more circuits" with --one or more circuits--.

Column 20
Line 6, Claim 20, please replace "supports one or more circuits" with --one or more circuits--.

Signed and Sealed this
Sixth Day of November, 2012

David J. Kappos
*Director of the United States Patent and Trademark Office*